United States Patent [19]
Turner

[11] 4,283,631
[45] Aug. 11, 1981

[54] BEAN SCANNING AND METHOD OF USE FOR ION IMPLANTATION

[75] Inventor: Norman L. Turner, Gloucester, Mass.

[73] Assignee: Varian Associates, Inc., Palo Alto, Calif.

[21] Appl. No.: 123,607

[22] Filed: Feb. 22, 1980

[51] Int. Cl.³ .................. B01D 59/44; A61K 27/02
[52] U.S. Cl. .......................... 250/492 B; 250/281; 250/288; 250/398
[58] Field of Search ............... 328/186; 250/492 R, 250/492 A, 429 B, 398, 281, 288

[56] References Cited

U.S. PATENT DOCUMENTS

| | | | |
|---|---|---|---|
| 2,414,096 | 1/1947 | Dimond | 328/167 |
| 2,858,434 | 10/1958 | Tollefson | 328/167 |
| 2,858,441 | 10/1958 | Gale | 250/492 B |
| 3,569,757 | 3/1971 | Brewer | 250/398 |
| 4,144,579 | 3/1979 | Nossen et al. | 328/167 |

*Primary Examiner*—Harold A. Dixon
*Attorney, Agent, or Firm*—Stanley Z. Cole; Edward H. Berkowitz

[57] ABSTRACT

In an ion implantation system, departure from uniform ion dosage of a planar workpiece is first compensated by modulating the scan rate of at least one coordinate of scan deflection in accordance with a non-linear waveform. The non-linear waveform is digitally synthesized from a plurality of contiguous linear segments, such segments having equal projection on the time axis. The pattern of two-dimensional scanning is then configured to correspond to an astable Lissajous figure. When the trace of such Lissajous figure returns to the initial origin of the pattern, the origin is then displaced by a fraction 1/n of the interval between parallel traces of the basic Lissajous pattern and the displaced Lissajous pattern is executed and again displaced n times until the interval has been traversed. The number n is chosen with reference to scan amplitude and the lateral extension of the beam at the workpiece; a sufficient noise component is tolerated in the deflection system to dither the beam about the average scan trace in order to remove small pattern in homogeneities.

8 Claims, 7 Drawing Figures

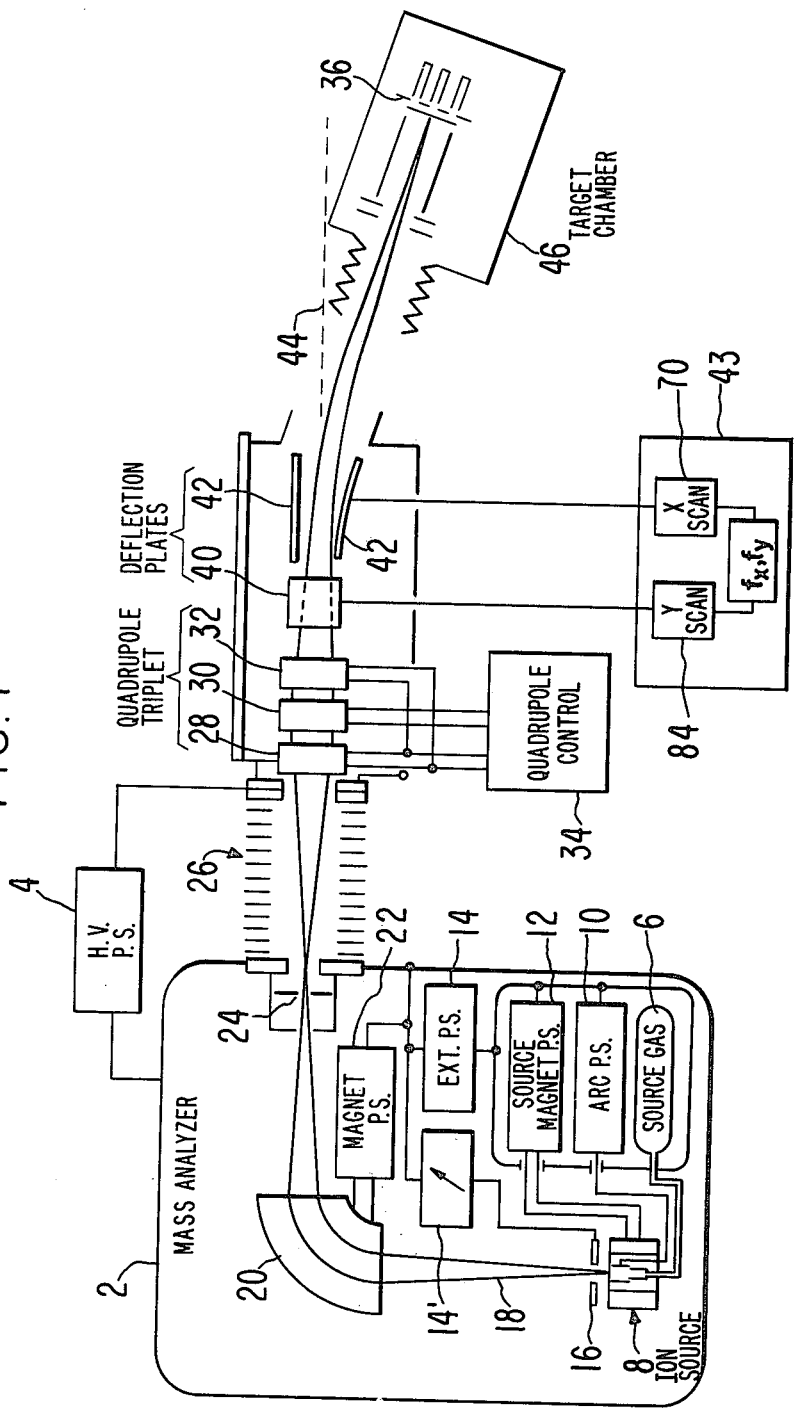

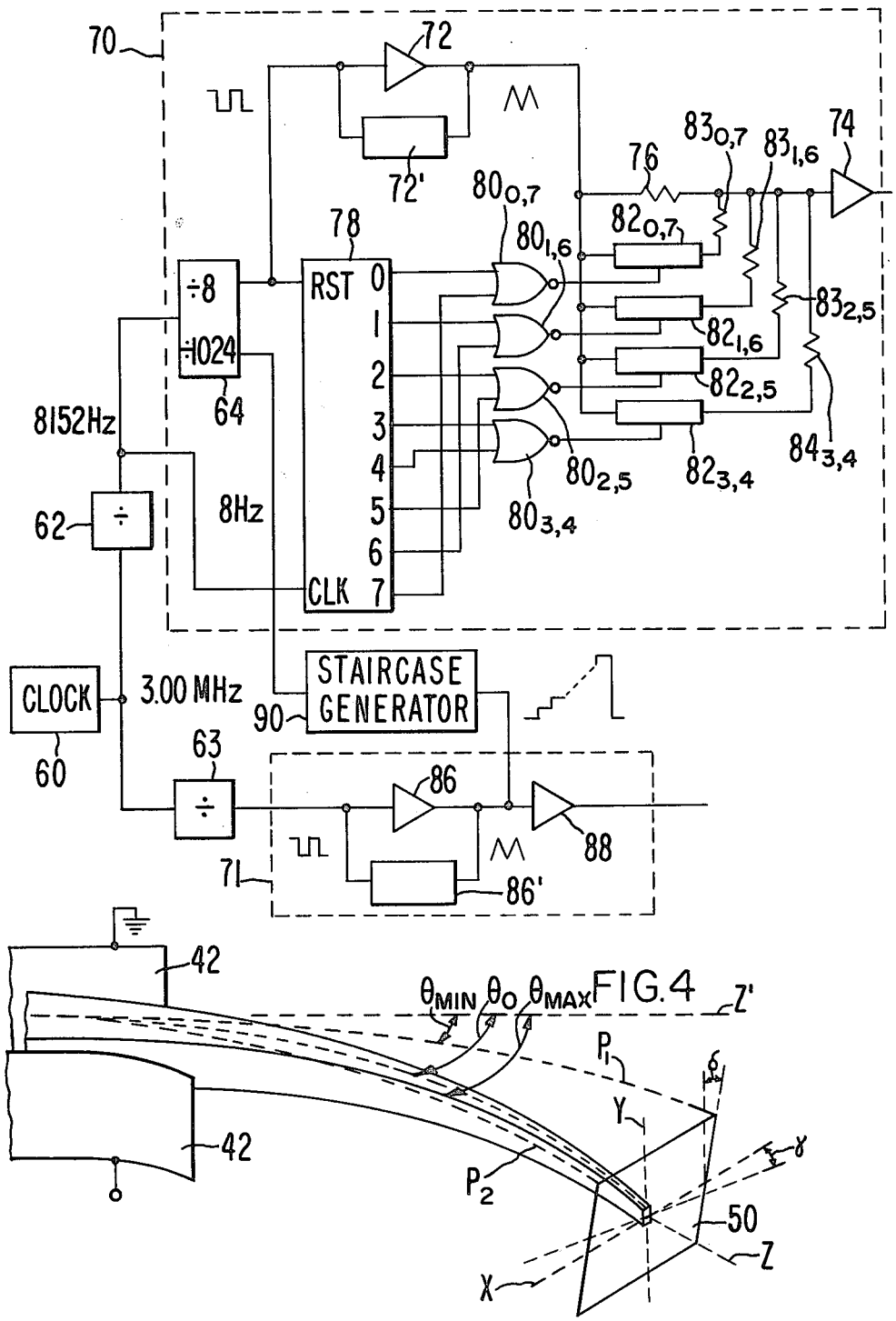

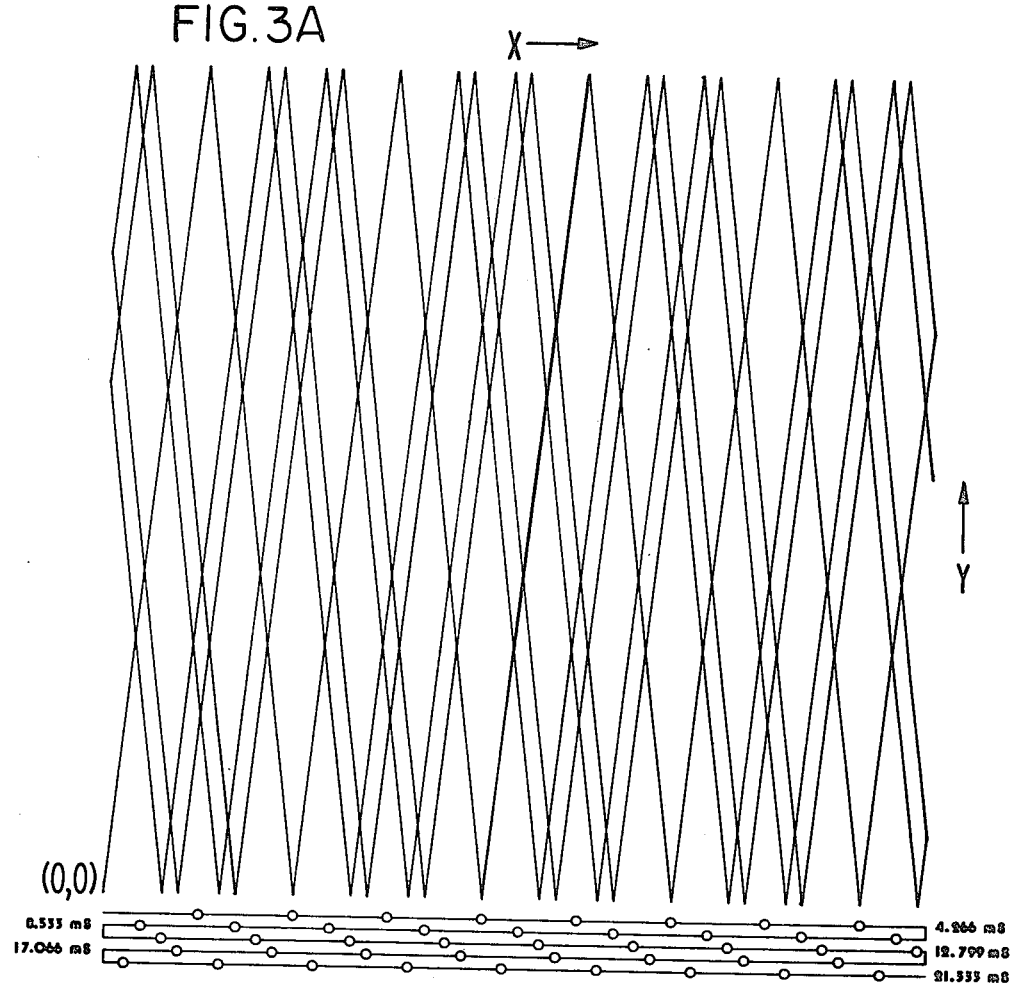

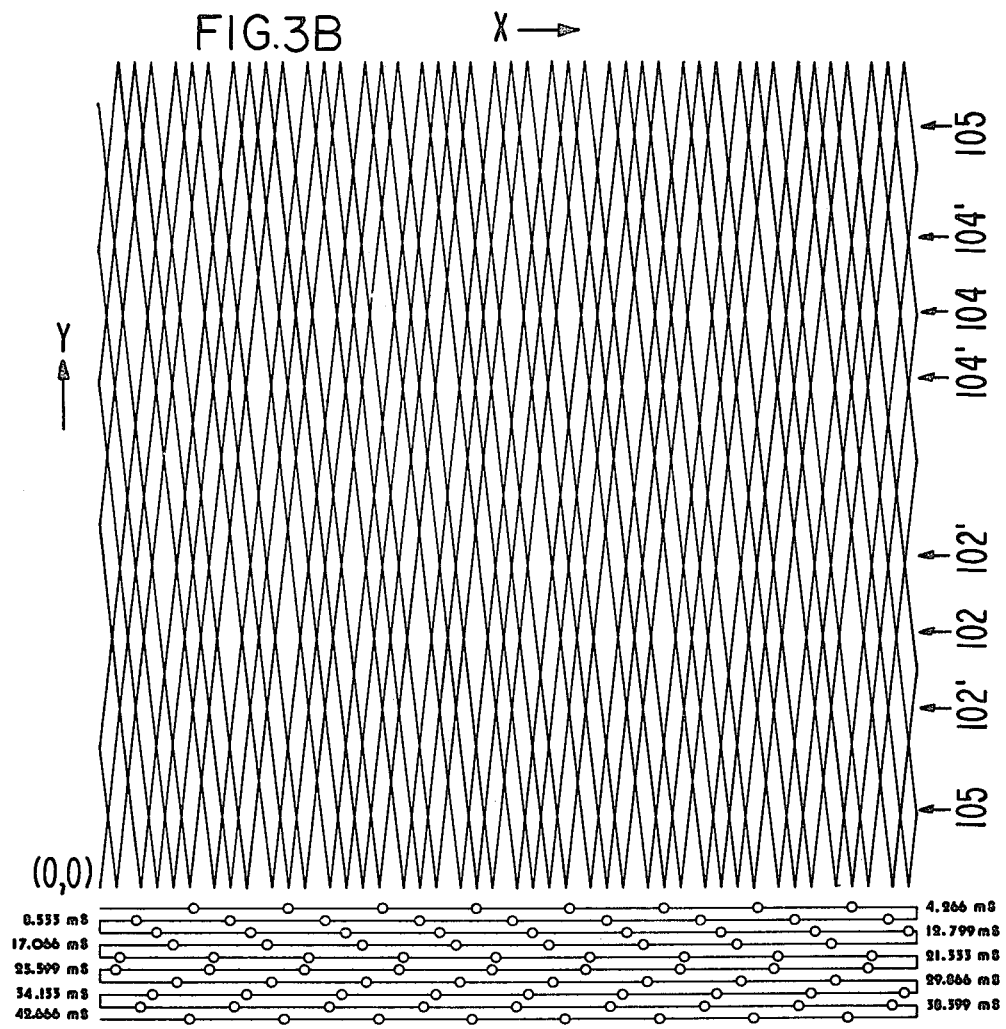

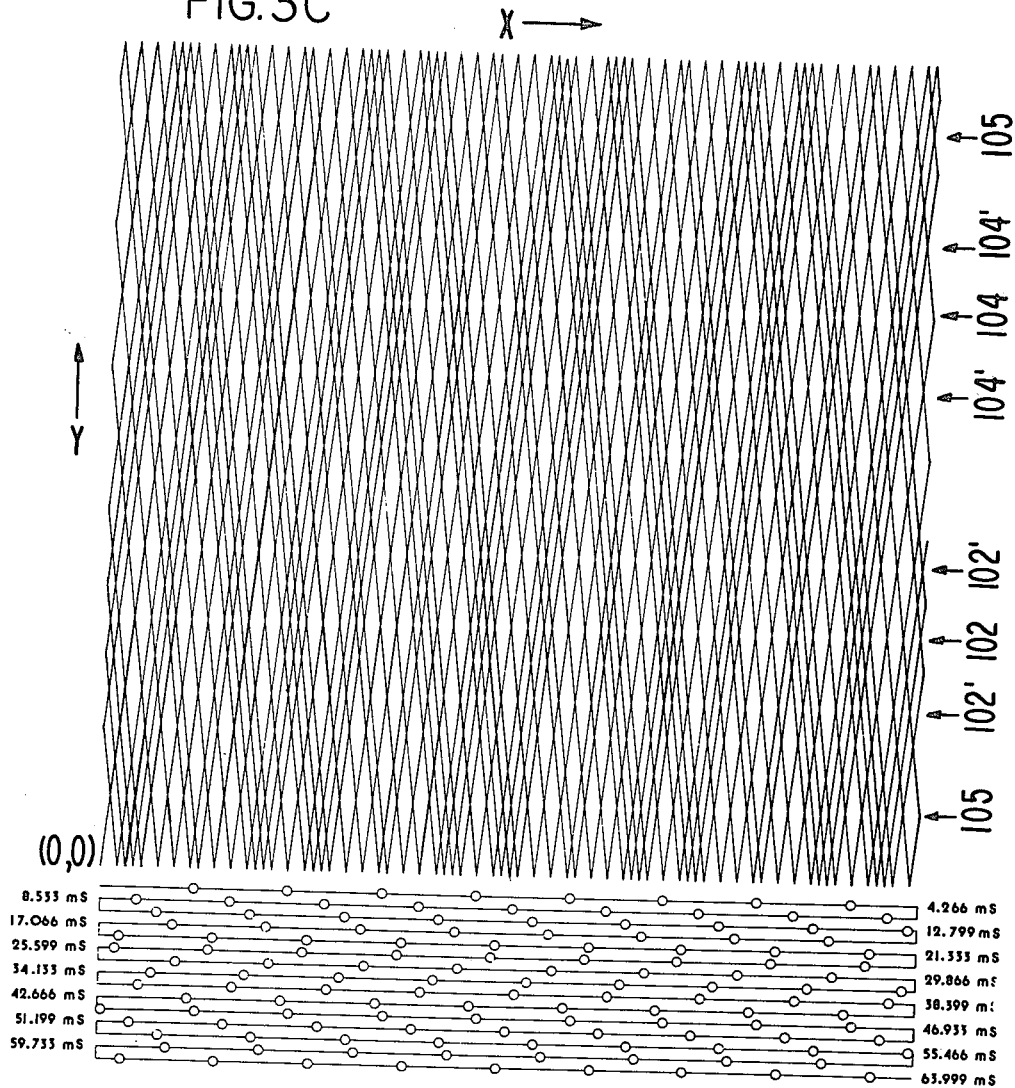

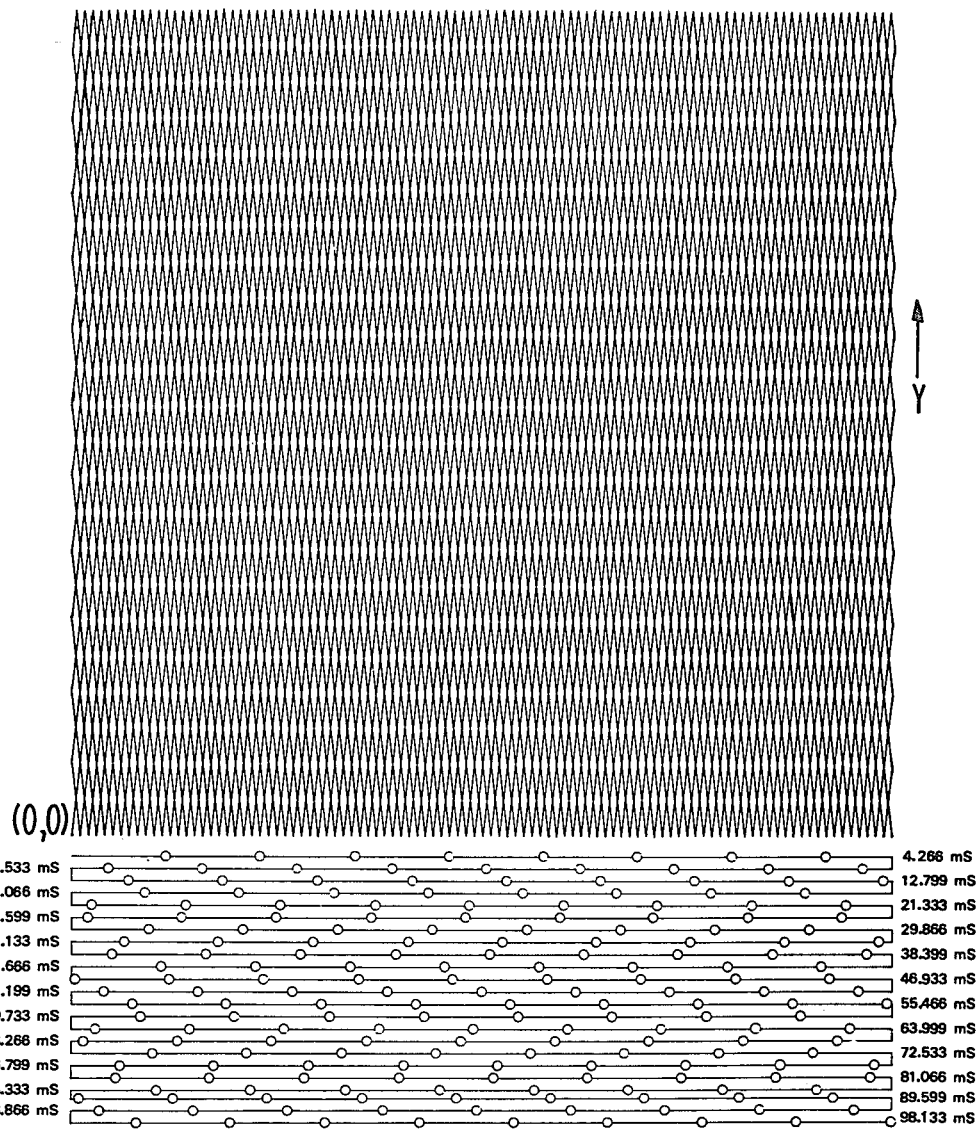

BEAN SCANNING AND METHOD OF USE FOR ION IMPLANTATION

DESCRIPTION

1. Field of the Invention

The present invention is in the field of control of scanned beams of charged particles for incidence upon a workpiece and more particularly relates to improvements in the uniformity of dosage or said charged particle beam said workpiece.

2. Background of the Invention

The irradiation of metals and semiconductor materials by ion beams provides a means for effecting the doping of such materials in a controlled and rapid manner. Ion implantation, as the process is known, is accomplished by illuminating, for example, a semiconductor wafer with an ion beam of controlled intensity for such integrated exposure as provides the desired dopant or impurity concentration. Uniformity of dopant concentration is a primary quality assurance desiderata. In systems wherein an ion beam is swept at constant transverse velocity across a planar semiconductor wafer it is known that the resulting areal dose concentration, instantaneous or integrated, will decrease slightly at the periphery of the scan compared to the concentration near the undeflected or central portion of the scan even in the absence of a neutral beam component. This is purely a geometrical effect arising (in the simplest case) from the projection upon a plane surface of a uniform spherical surface density. More generally, one can picture the solid angle variation as a consequence of a variation in angle of incidence of the beam as it is scanned across the wafer from a fixed center of deflection. In a typical commercial ion implanter processing a four inch diameter wafer, the effect is of the order of 1½% in density variation across the surface of the wafer.

The above described effect is most easily visualized wherein the ion beams strikes the central region of the semiconductor wafer or other workpiece at normal incidence and deflection means is employed to scan a beam in a oscillatory fashion across the workpiece. It will be clear that the solid angle subtended by a beam of constant cross section varies with the angle of incidence. This picture differs somewhat from actual practice in that normal incidence of the ion beam is ordinarily avoided for surfaces of oriented single crystal workpieces in order to thereby avoid crystal channeling effects which in turn affect the control of the depth of the ion penetration into the substrate. Thus, the plane of the substrate may be inclined and/or the undeviated beam direction may be arranged to strike the surface of the workpiece at an angle of the order of 6 to 8 degrees from the normal to the surface. Thus the angular variation of the angle of incidence will vary over a range which does not include normal incidence if channelling is to be avoided. Nevertheless, it will be appreciated that the variation of solid angle at the target over this range of angular incidence is yet one source of non-uniformity of dosage across the planar workpiece. This effect will be referred to as trace inhomogeneity.

Another source of trace inhomogeneity results from the common practice of applying a quiescent deflection to separate the charged beam from any neutral component. The latter is present due to charge exchange collisions of the beam with residual gases in the system. In typical apparatus a quiescent 7° offset is applied electrostatically to deflect the beam and the periodic scanning deflection, $+/-3°$, for example, is applied in addition thereto. The beam experiences a significant variation in angle of incidence over the extremes of the scan arising from the deflection process and from simple geometric relationships.

It should be fully recognized that it is most often desired to distribute the dose over the two-dimensional surface of the work piece and to this end the scan will be two-dimensional, or in the alternative, a one-dimensional beam scan will be accompanied by a cooperative mechanical oscillation of the work piece normal to the direction of the beam scan. Along the coordinate of mechanical oscillation the latter hybrid system avoids the above-discussed non-uniformity in the direction of mechanical oscillation because the beam is not deflected in that coordinate.

A further source of non-uniformity is attributed to the scanning pattern and attendant frequency relationships of the orthogonal deflection means which produce the scan. For convenience, it will be assumed that a two-dimensional electrostatic scan of an ion beam across a semiconductor wafer is to be corrected for the discussed non-uniformities. One will note that the frequency relationships of the deflection means give rise to Lissajous patterns over full cycles of both deflections. As the difference in orthogonal scan frequencies increases, the average uniformity (or density of scan lines) per unit area improves. In the prior art many full cycles of two-dimensional scanning are employed and an anharmonic relationship between scan frequencies to avoid standing Lissajous figures were thought sufficient for irradiation of a work piece.

One approach to compensating the variation of ion dose with deflection angle is to employ a non-linear waveform which has the effect of varying the transverse beam scan velocity in a desired relationship to the beam deflection angle. Thus, at the extreme deflection angle the beam scan velocity is decreased to permit the accumulation of a larger incremental dose per unit area. An analog approach for complex waveform synthesis for this purpose has been attempted wherein break points in the waveform are accomplished by diode and resistor combinations which provide a synthesis of desired linear time dependences. This method is difficult to accurately reproduce in a manufacturing environment and in any case, is extremely difficult to adjust.

BRIEF SUMMARY OF THE INVENTION

It is an object of the present invention to achieve improved uniformity of ion dose over the surface of a planar substrate scanned by an ion beam.

It is another object of the present invention to synthesize a desired non-linear waveform by digital circuit means for compensating non-uniformity in ion dosage of planar substrates by scanned ion beams.

In one feature of the present invention, the scan velocity rate, transverse to the predominant beam direction, is varied systematically by said non-linear waveform in respect to the displacement of the beam along a coordinate of the planar surface of the substrate wherein the cumulative dose delivered at any location on the planar surface is substantially independent of the coordinates of such location.

In another feature of the present invention the scan of said ion beam is controlled by a waveform generator wherein said waveform is synthesized from a plurality of contiguous linear waveform segments, said segments characterized by respective values of slope.

In yet another feature of the invention, orthogonally disposed deflection means produce a non-orthogonal scan pattern, the scan trace and retrace of said scan having an acute angular displacement therebetween.

In yet another feature of the present invention, the frequencies of signals applied to said deflection means are in anharmonic relationships whereby an astable Lissajous pattern is established.

In again yet another feature of the present invention the scan pattern is repeated n times and the origin for each repetition is displaced by $1/n \Delta X$ where $\Delta X$ is a measure of distance between scan lines.

In still again another feature of the present invention, noise in the deflection system is not reduced below a level desired for the further smoothing of the dosage distribution by fluctuation in the path of the scan.

In the present invention uniformity of deposition of ion dose along a given beam trace (trace homogeneity) is accomplished by modulating the rate at which the beam is displaced across the planar surface of the workpiece. The modulating function is synthesized digitally to compensate for the non-linear geometric variation over the workpiece surface of unit solid angle subtended thereon by the beam. Planar homogeneity is achieved by a series of scan patterns which distribute the individual scanning trajectories in approximately uniform density over the surface and wherein orthogonal deflection means are adjusted in relative intensity to produce a trace and retrace, each successive trace and retrace forming an acute angle therebetween. The relative frequencies of the deflection means are selected to yield an anharmonic (astable) Lissajous figure which assures a repetitive coverage over the planar area. Patterns inherent in the Lissajous distribution are corrected by repeating the planar scan n times with the origin of the scan displaced by a distance 1/n of the interval of reduced (or zero) dose concentration density. Finally, a sufficient amplitude of noise in the deflection system is tolerated in order to provide a further aspect of smoothing of the dosage distribution.

DESCRIPTION OF THE FIGURES

FIG. 1 is a schematic block diagram of a typical ion implantation system incorporating the present invention.

FIG. 2 is a block diagram of scanning apparatus of the present invention.

FIGS. 3A-D show the evolution of the scan pattern and the accompanying time base projections.

FIG. 4 shows the geometrical source of non-uniformity.

DETAILED DESCRIPTION OF THE INVENTION

The present invention in the functional context of an ion implantation system may be seen in FIG. 1. A high voltage terminal 2 is held at high potential relative to ground by high voltage power supply 4. Terminal 2 houses the apparatus required to form a beam of ions of desired species. In common practice a gaseous feedstock of the desired species is employed. To this end, a source gas produced from gas handling system 6 is directed to ion source 8. A typical ion source will require a power supply 10 to sustain an ionizing discharge, power supply 12 to impose an axial magnetic field across the discharge region, and extraction supply 14 and vernier 14' cooperating with extraction electrode 16 to shape the electric field at the aperture of the source for effective removal of a well defined high current ion beam. A more detailed description of ion source techniques is outside the scope of this work. See for example L. Valyi, "Atom and Ion Sources, Wiley-Interscience, 1978." The beam 18 diverging from the ion source 8 is momentum analyzed in analyzer magnet 20, the latter energized from analyzer power supply 22. Analyzed beam passes through analyzer exit slit 24 and then to accelerator tube 26 where it encounters a carefully designed field gradient from the high voltage terminal 2 to ground potential. Optical elements, such as a quadrupole triplet 28, 30, 32, and associated control system 34, operate to produce a spatial-energy focus at a desired image plane. Two sets of electrostatic deflection plates, 40 and 42, arbitrarily labeled y and x respectively serve to direct the beam over the desired area of the image plane. The waveform applied to the respective deflection plates and their synchronization to form the appropriate scanning program is accomplished by scanning system 43. The quiescent beam is deflected sufficiently to completely separate neutral beam 44 (arising from charge-exchange collisions with residual gases) from the charged beam. Target chamber 46 contains beam defining apertures, beam monitoring and integrating apparatus and equipment for introducing the wafer substrate in the vacuum system and aligning same with respect to the target plane.

Vacuum pumping apparatus and the vacuum envelope of the system is not indicated but it will be appreciated that the entire region traversed by the beam is maintained at high vacuum.

In a commercial context it is extremely important that a high degree of uniformity of ion dosage be maintained over the surface of the wafer and that the time required per wafer be minimal. Accordingly, it was determined that the implant time per wafer be less than 10 seconds and this parameter limits the scan program performed by scanning system 43 and the attendant frequencies of waveforms selected by application deflection plates. Additionaly, the frequencies are anharmonic with respect to the 50 or 60 Hz commonly employed in power transmission system.

The scanning system of the preferred embodiment is now described with the aid of FIG. 2. An anharmonic frequency ratio of 200:23 was selected for the scanning frequencies in the x and y directions. In the present work, the x coordinate is understood to refer to the coordinate in the plane of the quiescent offset deflection and orthogonal to the undeflected beam (z axis). A master clock 60 supplies a train of 3.00 MHz pulses to dividers 62 and 63. These dividers supply respectively 8152 Hz pulses to the x scan generator 70 and 117 Hz pulses to y scan generator 71. In the x scan generator 70, the 8152 Hz pulse train is split into 2 additional channels. One such channel provides an additional division by 8 to produce 1019 Hz pulses for the fundamental x scanning frequency. A second division of the 8152 Hz input by a factor 1024 results in an 8 Hz output for use discussed later below. The trace inhomogeneity compensation is obtained in the manner outlined by tailoring the waveform to the desired non-linear shape whereby the rate at which the beam is deflected is controlled. In the present invention it is recognized that a non-linear shape will be synthesized from a plurality of linear segments. To that end x scan generator 70 comprises a triangle wave generator 72 which drives scan amplifier 74 through resistor 76. Constant gain of the final amplifier 74 due to input resistance results in a linear sweep of the deflected beam. It will be appreciated that base restoration of the triangular signal is necessary and is accomplished by circuit 72' through means well known in the art but outside the scope of the present application. The triangle wave is obtained in straight forward manner by integration of the 1019 Hz square wave input. The slope of the liner sweep is altered by sequentially adding another resistance in parallel with input resistor 76. This is accomplished with the octal decoder 78 which counts the frequency of the 8152 Hz square wave applied to the triangle wave generator 72. A reset pulse at the 1019 Hz rate insures synchronization. Decoded outputs appear sequentially as pulses "0" through "7". The decoded outputs are ORed in gates 80 to produce outputs which follow a time symmetrical sequence. The decoded "0" output and the decoded "7" output are ORed by gate $80_{0,7}$ to enable linear gate $82_{0,7}$ which in turn connects resistor $76_{0,7}$ to parallel resistor 74.

In like manner the next-to-first and next-to-last outputs of the decoding sequence ("1" and "6") ultimately result in paralleling resistor $76_{1,6}$ to resistor 74 and similarly for outputs "2" and "5" together and "3" and "4" together. Thus an 8 segment symmetrical waveform is obtained, comprising different magnitudes of linear slope where both ascending and descending portions of the waveform are obtained by altering the gain of the scan amplifier. If so desired, an asymmetrical waveform of 8 segments could easily be formed by providing additional linear gates and paralleling resistances.

In a more general two-dimensional scanning apparatus the two orthogonal scan waveform generators can be identical, or exhibit rather different characteristics tailored to the precise effects to be compensated. For example, in the present system there are solid angle variations producing non-uniformity in both the X and y scans, but the relative size of these effects are quite different as a practical matter because of the additional quiescent offset deflections. The solid angle variation is discussed with the aid of FIG. 4. In this figure the undeflected beam defines the z' axis and the quiescent beam is subject to an offset deflection $\theta_0$ in the z-x plane due to deflection plates 42. The wafer is placed on the image plane 50 at an inclination angle $\delta$ (which could be zero) in the y-z plane. Similarly, the wafer can be oriented at an angle $\gamma$ in the z-x plane. For any offset deflection $\theta_0$, either, or both $\delta$ or $\gamma$ can be selected non-zero to assure non-normal incidence of the beam. Ordinarily the angle $\delta$ is selected to take on a value, typically in the neighborhood of 7° to avoid channeling effects. Ignoring tilt angle $\delta$, the trajectory extremes $P_1$ and $P_2$ of FIG. 3 exhibit respective angles of incidence of $\theta \pm \theta_0$. It can be shown that for a linearly deflected beam, the rate of dose accumulation in a scan trace interval dx is proportional to the square of the cosine of the angle of incidence. For $\theta_0 = 7°$ and $\theta$ in the range $-2\frac{1}{2}° \leq \theta \leq +2\frac{1}{2}°$ the percent non-uniformity edge-to-edge is proportional to $$\frac{\cos^2(\theta - \theta_0)}{\cos^2(\theta + \theta_0)} \simeq 1.021$$

or about 2.1 percent. It is important to remove systematic error of this magnitude.

Typically, the tolerance on dose non-uniformity for semiconductor fabrication is one standard deviation, or about 0.75%. If the wafer is not tilted in the y-z plane ($\delta = 0$), the solid angle variation is observed to be within this tolerance in the y scanning coordinate because the angular interval of the scan is small. For this reason, the preferred embodiment as described does not employ a non-linear waveform for the y scan, although such compensation is easily implemented where desired, in accord with the principles of this invention. Partly for the above reasons, in the preferred embodiment the y scan generator 71 is implemented, without non-linear compensation, from a triangle wave generator 86 with appropriate base restoration 86' to integrate square wave 117 Hz pulses from divider 63. The linear waveform is further amplified in amplifier 88 for output to the y deflection plates. The resulting x/y frequency ratio of 200/23 provides an astable Lissajous pattern which repeats with the period of the x scan (1019 Hz), that is 98.133 ms.

It is apparent that a tilt angle $\delta = 7°$ is geometrically equivalent to the effect of an effect angle $\theta_0 = 7°$ and a non-linear waveform is effectively utilized to compensate the y scan in such instance.

Turning now to FIGS. 3A-D, the evolution of the scan pattern is shown at various times. For the purpose of these figures, an infinitesimal beam cross-section is assumed. In FIG. 3A, two complete trace-retrace pairs or cycles have been performed, together with a third retrace in the x direction. At the same time in the y direction 21 complete trace-retrace pairs have been executed and an additional trace has been substantially completed. In FIG. 3B five complete trace-retrace cycles have been performed and in the y coordinate 43 trace-retrace cycles have been approximately completed. The reader is invited to consider this figure by observing it at a glancing angle along the x direction from the direction of the arrows (right margin): a number of striations are evident, the clearest of which are labeled 102 and 104. Evenly spaced to the sides of each of these, one perceives satellites 102' and 104'. Additional striations are also evident at the remaining arrows. These striations represent locii of maximum inhomegeneity in surface density of dosage distribution. The intersection of scan line segments are indicative of double dosage at the point of intersection while the diamond-shaped gaps described therebetween are areas which have received reduced dose.

In FIG. 3C, after 63.999 ms., the full evolution of the scan has encompassed seven trace-retrace cyles and an eighth trace in the x direction together with 65 cycles in the y direction. The striations noted on FIG. 3B are again indicated on FIGS. 4C for comparison. Additional striations are evident in FIG. 2C in the region between the previously noted striations. This can be regarded as the filling of the original diamond-shaped cells of reduced dosage or alternately that the size of the diamond-shaped cells diminishes as the scan progresses. In FIG. 3D the scan is completed with $11\frac{1}{2}$ cycles in the x coordinate and 100 cycles in the y coordinate. It will be observed that the striations are approximately even in "intensity" and that the interval between striations (in the y coordinate) has been reduced. The diamond-shaped cells of reduced or zero dosage have been rendered smaller still, the average dose concentration having been progressively distributed more evenly over the surface.

An interval $\Delta x$ characterizes the peak-to-peak distance between those concentration maximum. Thus, a voltage offset provided by staircase generator 90 is applied to the x-deflection means to shift the origin (0, 0) slightly along the striation to a position (x/n, 0) and the planar scan cycle (11½ cycles in the x coordinate) is repeated. For n such repetitions, the size of the diamond-shaped cells is again drastically reduced. It will be recalled that in driving the 1019 Hz frequency for the x scan a further divider output of substantially 8 Hz was derived in synchronization with the basic x scan rate. This relatively slow pulse train is applied to staircase generator 90 from which there is derived an output comprising an ascending sequence of 8 voltage plateaus. The voltage difference between the maximum and minimum plateaus are selected to correspond to the y scan increment (equal to the length of the diamond-shaped cells along the y direction). Consequently, this interval is again divided into 8 sub-intervals and the resulting output is summed with the y scan waveform to displace the y deflection at the completion of each frame of scanning as represented by FIG. 3D.

After eight repetitions of the above-described scan pattern the spacing between nominal dosage maxima has been reduced to approximately 1% of the entire scan amplitude. In the ion implantation system of the present invention the radius vector from the center of deflection is approximately 41 inches in order to maintain the total scan amplitude of about 7 inches corresponding to an angular range of $+/-2\frac{1}{2}°$ for a 4" wafer. Thus the nominal linear spacing between maxima is about 0.07 inches. A disc 95 is shown in FIG. 3D representing a wafer emplaced (at zero degrees tilt angle) for implantation. In operation the scan amplitude is adjusted to provide an overscan of about 20 percent in both x and y. Overscanning avoids complications arising from edge effects, beam turn-around and the like. Some of this overscan region is used for monitoring purposes through a system of faraday cups. In any irradiation system the scanning beam has a finite extension, or cross-section. Ordinarily the beam density has radial dependence which for present purpose may be assumed to have a constant portion with a gaussian decreasing portion. The cross-section of the beam may be defined by limiting apertures located at the ion source and at various places in the system. In the system of the present invention, the beam cross-section at the target is primarily an image of the beam extracted from the ion source. This is a rectangular shape determined by the ion source aperture. The resulting ribbon shaped beam of the preferred embodiment is oriented with major axis along the y direction, (orthogonal to the offset plane). The beam size is partially limited by apertures in the target chamber and the resulting beam spot typically assumes dimensions of 2 mm×10 mm for a low current system or 10 mm×20 mm for a high current system. The beam is not sharply off with these dimensions, but includes a tail. It will be seen that the beam half width can be of the order of, or large compared to the nominal minimum linear spacing of maxima as exhibited on the FIG. 3D. Consequently, the entire diamond-shaped cell or space between model dose maxima receives a dosage which is a superposition of at least the four traces which define the bounds of the cell.

The scan system as described provides a systematic pattern with smoothing on the microscopic level provided by the radial distribution of beam. Further smoothing is achieved by tolerating a sufficient noise component at the deflection plates. This provision for a dithering influence substantially removes a pattern non-uniformity which can remain at the microscopic level after smearing due to the overlapping gaussian portions of beam cross-section. In the present invention, typical deflection potentials for an electrostatic deflection system accomodating an angular range $+/-2\frac{1}{2}°$ vary in the range $+/-6000$ volts for a 250 kev B+ beam and in the range $+/-750$ volts for a 25 kev B+ beam. The noise present at the deflection output is not purposely reduced below the range 1 to 3 volts. Ordinarily this noise is attributable to power line harmonics. This noise component of deflection experienced by the beam can be directly expressed as fluctuation in beam trajectory. For the geometry discussed, the above relative rms noise amplitude produces an approximate spatial fluctuation of the order 4–8 mils at the target plane. This is a significant displacement relative to the size of the elementary model cell defined by the whole scan pattern, and especially compared to the displacement length of the origin of the pattern between repetition. Of course, the noise component can be adjusted as desired.

It is apparent that the density of scan lines, radial beam distribution and noise all contribute to the uniformity of a fast effective two-dimensional scan. Both the radial beam distribution and noise are commonly regarded as parasitic effects to be eliminated or reduced. The present work demonstrates that these parameters may be exploited to produce a useful effect. If the beam spot size were brought to a sharper focus and noise level further reduced, it would be necessary to increase the density of scan lines to fill up the cell. This would be achieved at the considerable expense of processing time and wafer throughput would suffer.

In like manner one skilled in the art will appreciate that the compensation of dosage non-uniformity might be accomplished by an appropriate scan trace pattern alone. In such an embodiment, inhomogeneity need not be separately compensated by a non-linear waveform. All sources of non-uniformity are regarded in the aggregate to yield a two-dimensional function which is compensated by an appropriate two-dimensional density of scan line distribution. This is accomplished by an appropriate scanning pattern. A microprocessor based pattern generator accomplishes this result with capability for executing a superposition of mathematically distinct patterns tailored to perform the desired compensation.

Although the above apparatus has been described for compensation of a specific geometric source of dose non-uniformity other phenomena affecting uniform ion dosage may be considered for compensation by an appropriately shaped waveform. Additional sources of non-uniformity can be encountered and compensated. The workpiece may not be a planar surface and in fact such a situation arises in ion implantation of wafers conformed to a non-planar cooled platen as described in U.S. patent application Ser. No. 021,362, thus contributing to an angle of incidence variation. Other compensible sources of non-uniformity of dosage will occur to one skilled in the art.

The foregoing descriptions and drawings are intended to be illustrative and not limiting. Various changes in form and details may be made without departing from the scope of the invention defined by the appended claims.

I claim:

1. An ion implantation system for irradiation of a workpiece comprising ion source means for production of a beam of ions, kinematic analysis means for resolving ion species present in said beam, ion optical means for forming and focusing said beam, and ion beam scanning means, said scanning means comprising at least one deflecting means for compensating non-uniformity of ion dosage along the path of a trace, said deflecting means controlled in response to a non-linear waveform, means for directing said trace in a two-dimensional pattern, means for repeating said trace for a preselected number of repetitions, each said repetition displaced from the remaining said repetition.

2. The system of claim 1 wherein said displacement between repetitions is of the order of the extension of the beam in the direction of said displacement.

3. The system of claims 1 or 2 wherein said deflecting means exhibits a time-dependent deflection component sufficient to disturb the path of incidence of said beam by an amount which is small compared to said displacement.

4. The system of claim 3 wherein said deflection component comprises noise.

5. In a scanning system for deflecting a beam of charged particles across a workpiece, linear periodic waveform means repetitive at a first frequency, amplifier means operative upon said linear periodic waveform, said amplifier exhibiting selected gain, a second frequency means operating at a second frequency greater than said first frequency means and synchronized with said first frequency, counter means responsive to said second frequency for activating in sequence each of a plurality of logical signals, a like plurality of linear switch means responsive to each said logical signals and means for selecting the gain of said amplifier in response to said linear switch means.

6. A method of securing uniform accumulated irradiation of a planar surface with a charged particle beam comprising:
(a) initializing an origin for the incidence of said beam on said surface,
(b) periodically deflecting said beam at a first frequency in one coordinate and concurrently periodically deflecting said beam at another frequency in another coordinate,
(c) continuing said period deflections until the pattern resulting from said deflection steps returns to said origin,
(d) displacing said origin, and
(e) repeating steps (b) through (d) inclusive a selected number of times.

7. The method of claim 6 wherein said displacement of said origin is directed between adjacent parallel traces.

8. The method of claim 7 wherein subselected number of repetitions times said displacement length equals said interval between said equidistant traces.

* * * * *